(12) United States Patent
Sofer et al.

(10) Patent No.: US 8,737,029 B2
(45) Date of Patent: May 27, 2014

(54) INTEGRATED CIRCUIT AND INTEGRATED CIRCUIT PACKAGE

(75) Inventors: Sergey Sofer, Reshon Letzion (IL); Yefim-Haim Fefer, Petah-Tikva (IL); Dov Tzytkin, Ness Zyiona (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/318,158

(22) PCT Filed: May 14, 2009

(86) PCT No.: PCT/IB2009/052022
§ 371 (c)(1),
(2), (4) Date: Oct. 31, 2011

(87) PCT Pub. No.: WO2010/131078
PCT Pub. Date: Nov. 18, 2010

(65) Prior Publication Data
US 2012/0050926 A1 Mar. 1, 2012

(51) Int. Cl.
*H02H 3/22* (2006.01)
(52) U.S. Cl.
USPC .......................... 361/56; 361/111
(58) Field of Classification Search
USPC .......................... 361/56, 111
See application file for complete search history.

(56) References Cited

U.S. PATENT DOCUMENTS

| | | | |
|---|---|---|---|
| 5,771,140 A | 6/1998 | Kim | |
| 6,014,298 A | 1/2000 | Yu | |
| 7,233,468 B2 | 6/2007 | Chang et al. | |
| 8,054,596 B2 * | 11/2011 | Koyama et al. | 361/56 |
| 2002/0084490 A1 | 7/2002 | Ker | |
| 2005/0047042 A1 | 3/2005 | Satou et al. | |
| 2007/0133137 A1 | 6/2007 | Dornbusch | |
| 2008/0062597 A1 | 3/2008 | Chen et al. | |
| 2008/0074171 A1 | 3/2008 | Bhattacharya | |
| 2008/0123228 A1 * | 5/2008 | Hung | 361/56 |
| 2008/0217656 A1 | 9/2008 | Huang | |
| 2008/0316660 A1 | 12/2008 | Huang et al. | |

FOREIGN PATENT DOCUMENTS

WO 2008122840 A1 10/2008

OTHER PUBLICATIONS

Ker Ming-Dou et al.: "ESD Protection Design to Overcome Internal Damage on Interface Circuits of a CMOS IC With Multiple Separated Power Pins" Components and Packaging Technologies, IEEE Transactions, Sep. 2004, vol. 27, Issue 3, pp. 445-451.

(Continued)

*Primary Examiner* — Danny Nguyen

(57) ABSTRACT

An integrated circuit, comprises a power supply node being connectable to a voltage supply (Vdd); a ground node connectable to ground (GND); and an electrostatic discharge protection structure for diverting an electrostatic discharge away from protected parts of the integrated circuit. A gated domain is present which is supply gated and/or ground gated with respect to the power supply node and/or the ground node, as well as a gating switch for gating the gated domain relative to the power supply node and/or the ground node. The gating switch enables in a connecting state, and in a disconnecting state inhibits, an electrical connection between the gated domain and at least one of: the power supply node and the ground node. The integrated circuit includes ESD gating control circuitry for controlling in case of an electrostatic discharge event the gated domain to be electrically connected to the power supply node and/or the ground node.

11 Claims, 2 Drawing Sheets

(56) References Cited

OTHER PUBLICATIONS

Sofer Sergey, et al: "Indirect Electrostatic Discharge Stressing Mechanism in VLSI Chips with Multiple Power Supply Domains" ISTFA 2006: Proceedings of the 32nd International Symposium for Testing and Failure Analysis, pp. 389-392.

International Search Report and Written Opinion correlating to PCT/IB2009/052022 dated Feb. 17, 2010.

\* cited by examiner

US 8,737,029 B2

INTEGRATED CIRCUIT AND INTEGRATED CIRCUIT PACKAGE

FIELD OF THE INVENTION

This invention relates to an integrated circuit and an integrated circuit package.

BACKGROUND OF THE INVENTION

Typically, integrated circuits (IC) are provided with an ESD (Electro Static Discharge) protection circuitry. The ESD protection circuitry protects parts of the IC by clamping ESD-stressed terminals during an ESD event, and serves to divert the electrostatic discharge current away from protected parts of the IC, and thus to dissipate the stress energy without damage to the IC.

It is known to provide such ESD protection circuitry to integrated circuits provided with power gating capabilities. Such integrated circuits typically include one or more on-die semiconductor switches, from hereon referred to as the gating switches, which connect local power supply and/or ground of one or more circuit blocks, from hereon referred to as a gated domain, to the main or continuous power supply and/or ground respectively. The gating switch has a low impedance in a closed (connecting) state, and a high impedance in an open (disconnecting) state. The power supply to the power gated domain can be enabled or disabled by the state of the gating switch. Thus, the power supply to a gated domain can be turned off temporarily when not needed, e.g. to reduce the overall power consumption of the integrated circuit or to reduce the noise level. This temporary shutdown time is also referred to as "low power mode" or "inactive mode". When the circuit blocks of the gated domain are required again, they are activated to an "active mode" and the switch is put in the closed state, enabling the connection to the power supply or ground.

As described in M.-D. Ker; C.-Y. Chang; Y.-S. Chang: "ESD protection design to overcome internal damages on interface circuits of CMOS IC with multiple separated power pins", *Proceedings 15th Annual IEEE International ASIC/SOC Conference*, p. 234-238, 2002, in case an integrated circuit has different circuit blocks with different power supplies, ESD stress applied to a circuit block may cause damage to the interface with another circuit block.

S. Sofer, Y. Fefer, Y. Shapira, "Indirect ESD stressing mechanism in a VLSI circuits having multiple isolated power domains", *Proceedings of 32nd ISTFA* 2006, p. 389-392, 2006 describes that ESD stress applied to a circuit block may actually cause damage to an area located inside another circuit block which is isolated from the block to which the ESD stress is applied. Accordingly, in case an integrated circuit with gating capabilities is subject to an ESD event, the ESD stress may penetrate to the not-protected, gated domain(s) and damage parts of the gated domain(s), such as the semiconductor components at the interface of the power gated domain.

SUMMARY OF THE INVENTION

The present invention provides an integrated circuit and an integrated circuit package, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
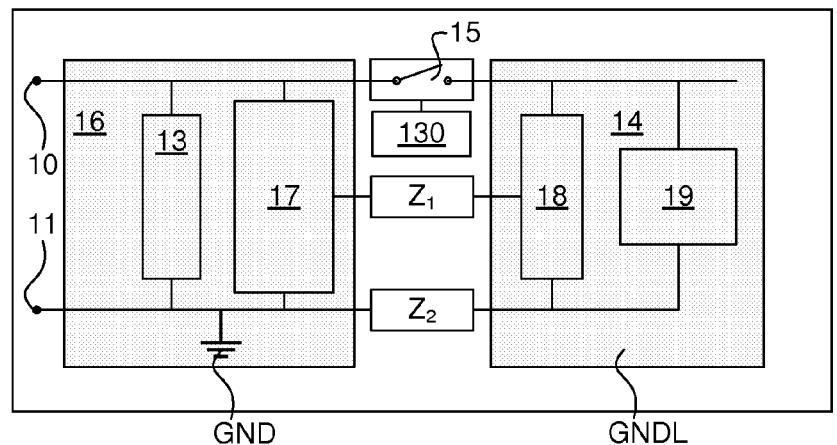
FIG. 1 schematically shows a block diagram of an example of an embodiment of an integrated circuit.

Referring to FIG. 1, the example of an integrated circuit (IC) 1 shown therein comprises a power supply node 10, a ground node 11, an electrostatic discharge protection structure 13, a gated domain 14 and a gating switch 15. The power supply node 10 can be connected to a voltage supply (Vdd) and the ground node 11 to ground (GND), e.g. via a pad on an IC die on which the IC 1 is present.

In the shown example, the electrostatic discharge protection structure is a ESD protection circuit 13, dedicated to providing ESD protection, which physically connects the power supply node 10 to the ground node 11 and in case of an ESD event provides an electrical connection which diverts the electrostatic discharge current caused by the electrostatic discharge away from protected parts of the integrated circuit 1. More in particular, in this example the ESD protection circuit 13 enables (either in an active or a reactive manner) a low impedance path between the power supply node and the ground node in case ESD stress is applied between the power supply node and the ground node. The ESD protection circuit 13 may for example clamp the power supply node 10 and the ground node 11 and thus provide electrostatic charge discharging, diverting the ESD current away from protected parts of the integrated circuit 1. It will be apparent that any suitable ESD protection circuit, such as known clamping circuits, may be used.

In the absence of an ESD event stressing the integrated circuit, either during normal operation of the IC or when the IC is not operating (e.g. when not connected to any power supply etc, such as after manufacturing but before mounting the integrated circuit on a board), the ESD protection circuit can be inactive, but the ESD protection circuit will take an action when an ESD event hits the integrated circuit, which reduces the risk of damages to the integrated circuit.

In the shown example, the ESD protection circuit 13 is an on-die circuit provided on the same die as the gated domain 14. However, additionally or alternatively, the ESD protection circuit 13 may be an external circuit e.g. provided on a separate die and connected, for example via bond wires or a solder connection, to the power supply node 10 and ground node 11. Furthermore, it will be apparent that the electrostatic discharge protection structure may in addition or alternatively be a self-protection structure.

In the shown example, the gated domain 14 is supply gated with respect to the power supply node. However, the gated domain 14 may be power gated in another manner, and for example alternatively or additionally be ground gated with respect to the ground node. In FIG. 1, a gating switch 15 is shown. The gating switch 15 gates in this example the gated domain relative to the power supply node 10 in FIG. 1, and may be referred to as a supply gating switch. However, alternatively or additionally, the gating switch may gate the gated domain 14 relative to the ground node, in which case the gating switch may be referred to as a ground gating switch or separate ground gating switch may be present.

The gating switch 15 enables in a connecting state, and in a disconnecting state inhibits, an electrical connection between the gated domain 14 and the power supply node 10. Thereby, the supply gating switch 15 can control whether or not the gated domain 14 is supplied with power. Alternatively or additionally, when the gating switch 15 gates the gated domain 14 relative to the ground node 11, the gating switch 15 may enable and inhibit an electrical connection between the gated domain 14 and the ground node 11 in the connecting state and the disconnecting state respectively.

It has been found that during an ESD event the impedance of the gating switch may exhibit a non-deterministic behaviour, which causes e.g. a complete or partial disconnection of the power gated domain from the ESD protection. Thus, in such case, the gated domain may be isolated relative to the domain of the power supply and/or ground, from hereon referred to as the continuous power domain.

As shown, the integrated circuit 1 includes ESD gating control circuitry 130. In case of an electrostatic discharge event, the ESD gating control circuitry 130 controls the gated domain to be electrically connected to the power supply node (or the ground node). In the absence of an ESD event stressing the integrated circuit, control of the connection by the ESD gating control circuitry 130 is absent.

Accordingly, the gated domain may benefit from the protection provided by the ESD protection structure and damage to the gated domain 14 due to an ESD event may be prevented.

In FIG. 1, the ESD gating control circuitry 130 is, for illustrative purposes, shown connected to the gating switch 15 and may e.g. control the state of the gating switch 15 such that the gating switch is in the connecting state in case of an ESD event, such as when an electrostatic discharge causes a current flow between the supply and ground nodes. The current may for example flow from the supply node 10 to the ground node 11 or from the ground node 11 to the supply node 10 and be diverted by the electrostatic discharge protection circuit 13, away from e.g. analog or digital circuitry 17,19. However, the ESD gating control circuitry 130 may control the gated domain to be electrically connected to the power supply node and/or the ground node in case of an electrostatic discharge event in any other manner suitable for the specific implementation. Accordingly, the ESD gating control circuitry 130 may be implemented in any manner suitable for the specific implementation.

As shown in FIG. 1, the gated domain 14 may comprise a domain interface circuit 18 and analog or digital circuitry 19. The domain interface circuit 18 connects the analog or digital circuitry 19 situated in the gated domain 14 to another domain 16, which comprises analog or digital circuitry 17, protected by the ESD protection circuitry 13. In this example, the other domain is a continuous domain 16 which is not gated with respect to the power supply node 10 or ground 11. However, it will be appreciated that the domain 16 may be gated and that the gating switch 15 may connect the gated domain 14 to domains which do not comprise ESD protection circuitry.

Figure 2:
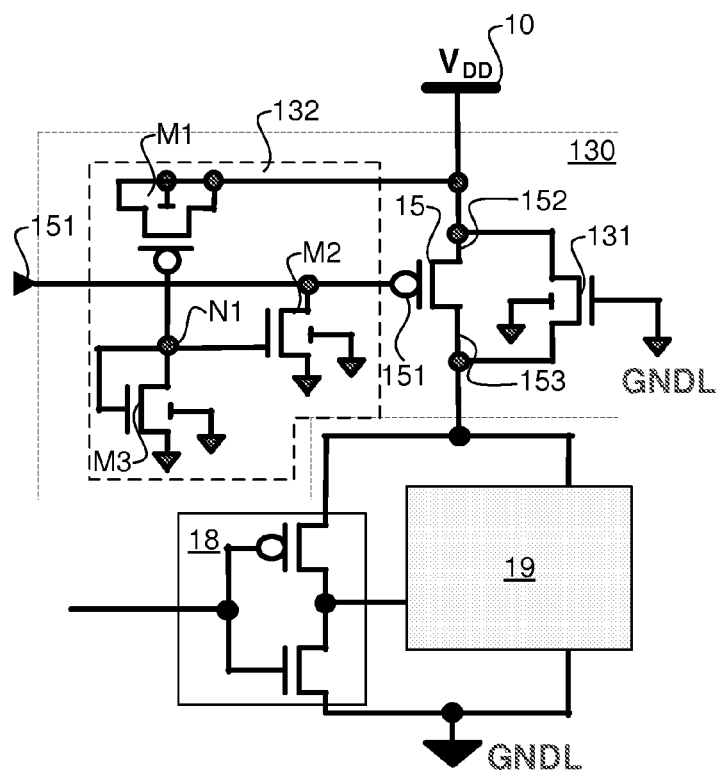
FIG. 2 schematically shows a circuit diagram of an example of a gating circuit suitable for the example of FIG. 1.

In the example of FIG. 1, impedances $Z_1,Z_2$ are shown which connect the domain interface circuit 18 in the gated domain 15 to the analog or digital circuitry 17 in the continuous domain 16 and the local ground of the gated domain 14 to the ground node 11. The impedances $Z_1,Z_2$ form part of a path through which a detrimental ESD current can flow into the gated domain 14, which may thus damage e.g. parts of the domain interface circuit 18. As shown in FIG. 2, the domain interface circuit may for example comprise a CMOS transistor of which the gate terminal is connected to the continuous domain via impedance $Z_1$ and the ESD current may e.g. damage the gate oxide of the PMOS part of the CMOS transistor. The ESD gating control circuitry 130 allows to ensure that the ESD current is diverted by the ESD protection circuitry 13 and hence that damages to the interface circuit 18 be prevented.

As mentioned before, the ESD gating control circuitry 130 may be implemented in any manner suitable for the specific implementation. The ESD gating control circuitry 130 may control in case of an ESD event the gating in multiple manners. For example, the ESD gating control circuitry 130 may enable a bypass to the path through the gating switch 15, e.g. in case of a first type of ESD, or control the state of the gating switch 15, e.g. in case of a second type of ESD different from the first type by direction of ESD current.

More specific, as shown in the example of FIG. 2, the electrostatic discharge gating control circuitry 130 may for example comprise a bypass to the electrical connection, which is enabled in case of an ESD event. As shown, the bypass may provide a path between the current terminals 152,153 of the gating switch 15, as an alternative to the path between the current terminals 152,153 through the gating switch 15. The bypass may for example comprise a bypass switch 131 which enables the bypass in case of an electrostatic discharge event. The gated domain 14 may e.g. have a local ground GNDL connected to the ground node 11 (in this example via impedance $Z_2$) and the bypass switch 131 may have a control input connected to the local ground GNDL, which enables the bypass when a voltage difference between the local ground and the power supply node exceeds a predetermined threshold.

In the example of FIG. 2, for instance, the gating switch 15 is implemented as a transistor switch, of which the state can be controlled via a switch control node 151 (e.g. by a, not shown, gating control unit). The bypass switch 131 is implemented as a transistor switch which is connected with its control terminal (e.g. its gate) to the local ground GND and connected with current terminals (e.g source and drain respectively) to the current terminals of the gating switch 15. In case an ESD event raises the ground voltage, and causes an ESD current flowing in the direction from the ground node 11 towards the power supply node 10, such that the voltage applied to the control terminal (i.e. the ground voltage) exceeds a switching threshold, this will cause opening of the bypass switch 131. The bypass switch 131 will thus enable the bypass, thereby ensuring that the gated domain 19 is electrically connected to the power supply node 10 and ground node 11. Accordingly, the ESD protection circuitry will protect the gated domain 19. It should be noted that the switching threshold voltage may be predetermined and have any value suitable to ensure that the bypass is enabled during an ESD event while not affecting of the gating mechanism during the IC normal operation.

In the example of FIG. 2, the bypass switch 131 is arranged to enable the bypass in order to divert a negative discharge current (e.g. from ground to power supply). In the shown example, the power switch 15 is uni-directional and the bypass enables a transfer of ESD current flowing in another direction than the direction of the power switch 15. For example, the ESD stress may have different polarity than the direction of the power switch 15 or the ESD polarity may invert during the stress event. However, alternatively or additionally the bypass may be enabled to divert a positive discharge current.

As shown in FIG. 2, more in particular, the bypass switch 131 for instance may be implemented as a pass transistor, in this example a NMOSFET (N-type Metal Oxide Semiconductor Field Effect Transistor), whose gate is connected to the local ground GNDL.

Referring again to FIG. 2, in addition or alternatively to the bypass, the ESD gating control circuitry 130 may include gating switch control circuitry 132 which forces the gating switch 15 to be in the connecting state in case of an electrostatic discharge event, e.g. which causes a current flow from the supply node to ground or vice versa.

As shown in FIG. 2 the gating switch 15 may for instance have a control terminal 151 at which a control voltage may be provided which controls the state of the gating switch 15. In this example, the gating switch 151 is in the connecting state when the control voltage is in a predetermined range. The gating switch control circuit 132 may comprise a control switch (transistor M2 in the example) which (in response to a voltage difference between a node at one side of the gating switch and a node at another side of the gating switch exceeding a predetermined threshold) connects the control terminal 151 to a node of a voltage within the predetermined range in case of an ESD event, such as an ESD event which raises the supply voltage and causes an ESD current flowing in a positive direction, i.e. from the power supply node 10 towards the ground node 11.

The gating switch control circuitry 132, when in operation, may control the gating switch 15 to be in the connecting state, and hence the gated domain 14 to be electrically connected to the power supply node 10 (or the ground node 11 in the case of the ground gating) in case the potential difference between the power supply node and a gated supply node of the gated domain exhibits behaviour characteristic to the ESD event. For example, the potential may exceed a predetermined threshold and/or exhibit a rate of change characteristic for an ESD event, and an appropriate slew rate, for example of at least 200 Volt per microsecond, may be set which triggers control of the state of the gating switch. It will be apparent that the gating control circuit may be arranged to be inactive, i.e. not control the gating switch when the potential difference does not exhibit ESD characteristic behaviour, e.g. when the rate of change is below an ESD characteristic slew rate.

As shown in FIG. 2, for example, the control terminal of transistor M2 is connected to a node between the control terminal of a transistor M1 and a current terminal of a transistor M3, while the current terminals of the transistor M2 are connected to ground and the control terminal 151 respectively. The transistors M1, M3 form a differentiating circuit, such that the voltage at the node N1 is proportional to the rate of change of the supply voltage Vdd. When the rate of change is below a threshold value, the transistors M3 ensure that the transistor M2 is closed, i.e. no current can flow through the transistor M2, and therefore the control node 151 is disconnected from ground GND, i.e, M1,M3 circuit does not influence the state of swich transistor 15. The threshold value may for example correspond to a rate of change of 200 V/μsec.

When the voltage difference between the power supply node 10 and the ground node 11 grows fast and the rate of change exceeds the threshold value (which corresponds to ESD event and cannot occur during normal functioning of the IC chip), the transistors M1,M3 open the gate of the transistor M2, thereby connecting the control terminal 151 to ground GND, resulting in a discharge (if any electric charge exists) of the control terminal 151, and causing the gating switch 15 to be in a connecting state.

More in particular, as mentioned, in the example of FIG. 2, transistors M1 and M2 form a differentiating circuit, where transistor M1 serves as the MOS capacitor and transistor M3 serves as the (large) resistor. A fast rise of the positive voltage between the power supply node 10 and the local ground GNDL of the gated power domain will cause a charging of the MOS capacitor M1. This charging will cause a voltage drop over the transistor M3, proportional to the rate of change of the positive voltage. When the voltage drop exceeds the switching threshold of the transistor M2, the pull-down transistor M2 will connect the control terminal 151 to ground GNDL and as a consequence the gating switch 15 be closed, i.e. in the connecting state, which is in its turn connects the isolated power domain to the continuous power domain and thus ensures its ESD protection.

The aforementioned opening of the switch transistor 15 causes halt of capacitive current of the MOS capacitor M1 and as the result the voltage drop over transistor M3 disapearsand the voltage at node N1 drops below the threshold voltage and closes the transistor M2. In such case the voltage at the gate 151 of the switch 15 will be already at zero, and the ESD have completed as well. During normal functional operation of the IC chip the gate of transistor M2 is tied to the local ground GNDL, due to the leakage current via the transistor M3 which makes that node N1 is at the local ground voltage, thereby keeping the transistor M2 closed and not interfering the regular switch control.

Figure 3:
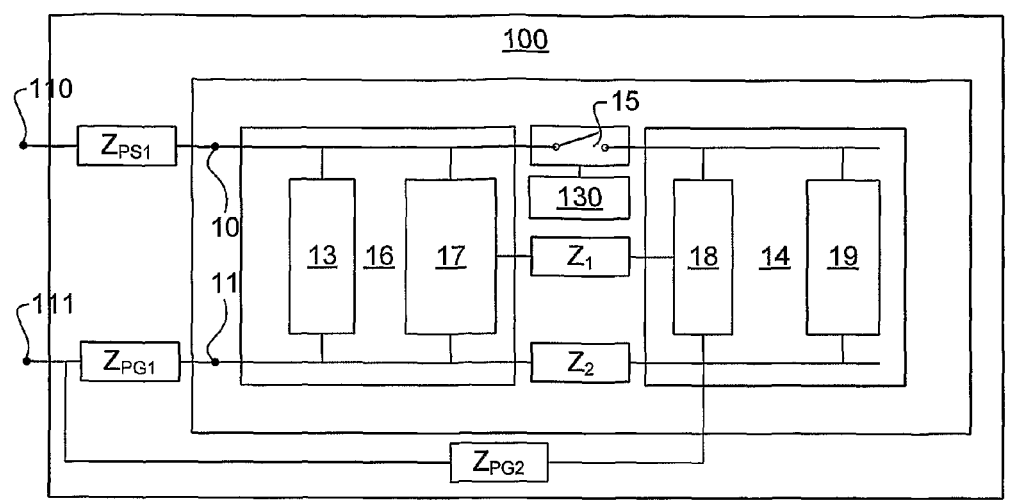
FIG. 3 schematically shows a block diagram of an example of an embodiment of an integrated circuit package.

Referring to FIG. 3, an example of an integrated circuit package is shown. The shown example comprises an integrated circuit, which may for example be an IC 1 as shown in FIG. 1, and a cover 100 which covers at least part the integrated circuit 1 (in FIG. 3 the package is shown in an opened state. The package has a first pin 110 connected to the power supply node and a second pin 111 connected to the ground node 11 As shown, impedance $Z_{PS1}$ is present between the first pin 110 and the power supply node 10, while impedances $Z_{PG1}, Z_{PG2}$ are present between the second pin 111 and respectively the ground node 11 and the interfacing circuit 18 of the gated domain. The ESD gating control circuitry 130 ensures that the gated domain 14 benefits from the ESD protection and may reduce the risk that an ESD current flows through the path of $Z_{PG1}$, ground node 11, $Z_1$ and $Z_2$, as well as $Z_{PG2}$ into the gated domain 14.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An integrated circuit, comprising:
   a power supply node being connectable to a voltage supply (Vdd);
   a ground node connectable to ground (GND);
   an electrostatic discharge protection structure operable to divert an electrostatic discharge away from protected parts of the integrated circuit;
   a gated domain which is supply gated and/or ground gated with respect to said power supply node and/or said ground node, the protected parts of the integrated circuit comprising the gated domain;
   a gating switch operable to gate said gated domain relative to said power supply node and/or said ground node, said gating switch enabling in a connecting state, and in a disconnecting state inhibiting, an electrical connection between said gated domain and at least one of: said power supply node and said ground node; and
   electrostatic discharge gating control circuitry operable to control said gated domain to be electrically connected to said power supply node and/or said ground node in case of an electrostatic discharge event.

2. An integrated circuit as claimed in claim 1, wherein said electrostatic discharge gating control circuitry comprises, in addition to said electrical connection, a bypass to said electrical connection between said gated domain and at least one of: said power supply node and said ground node and a bypass switch which enables said bypass in case of an electrostatic discharge event.

3. An integrated circuit as claimed in claim 2, wherein said gated domain has a local ground (GNDL) connected to said ground node and wherein said bypass switch has a control input connected to said local ground and wherein said bypass switch enables said bypass when a voltage difference between said local ground and said power supply node exceeds a predetermined threshold.

4. An integrated circuit as claimed in claim 3, wherein said predetermined threshold is 2 V or more and/or 4 V or less.

5. An integrated circuit as claimed in claim 2, wherein said bypass switch is arranged to enable said bypass in order to divert a negative discharge current and/or to divert a positive discharge current.

6. An integrated circuit as claimed in claim 1, wherein said electrostatic discharge gating control circuitry includes gating switch control circuitry for controlling said gating switch to be in said connecting state in case of an electrostatic discharge which causes a current flow between said power supply node and ground.

7. An integrated circuit as claimed in claim 1, wherein:
   said gating switch has a control terminal for providing a control voltage and said gating switch is in said connecting state when said control voltage is in a predetermined range, and
   said gating switch control circuitry comprises a control switch (M2) for enabling a path connecting said control terminal to a node of a voltage within said predetermined range, in response to at least one parameter of a voltage difference between a node at one side of said gating switch and a node at another side of said gating switch exceeding a rate threshold.

8. An integrated circuit as claimed in claim 7, wherein said parameter is a rate of change of said voltage difference.

9. An integrated circuit as claimed in claim 7, wherein said rate threshold is at least 200 Volt per microsecond.

10. An integrated circuit as claimed in claim 1, wherein said electrostatic discharge gating control circuitry is inactive when said integrated circuit is not subject to an electrostatic discharge event.

11. An integrated circuit package, comprising:
   an integrated circuit as claimed in claim 1; a cover which at least part said integrated circuit, said package having a first pin connected to said power supply node and a second pin connected to said ground node.

* * * * *